US011973006B2

United States Patent
Gambino et al.

(10) Patent No.: US 11,973,006 B2
(45) Date of Patent: Apr. 30, 2024

(54) SELF-ALIGNED CONTACT OPENINGS FOR BACKSIDE THROUGH SUBSTRATE VIAS

(71) Applicant: SEMICONDUCTOR COMPONENTS INDUSTRIES, LLC, Phoenix, AZ (US)

(72) Inventors: Jeffrey Peter Gambino, Gresham, OR (US); Swarnal Borthakur, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 28 days.

(21) Appl. No.: 16/948,874

(22) Filed: Oct. 5, 2020

(65) Prior Publication Data

US 2021/0111102 A1 Apr. 15, 2021

Related U.S. Application Data

(60) Provisional application No. 62/914,289, filed on Oct. 11, 2019.

(51) Int. Cl.
*H01L 23/48* (2006.01)
*H01L 21/48* (2006.01)
(Continued)

(52) U.S. Cl.
CPC ........ *H01L 23/481* (2013.01); *H01L 21/4814* (2013.01); *H01L 25/18* (2013.01)

(58) Field of Classification Search
CPC ... H01L 23/481; H01L 21/4814; H01L 25/18; H01L 24/08; H01L 2224/08121;
(Continued)

(56) References Cited

U.S. PATENT DOCUMENTS

| 6,165,898 A * | 12/2000 | Jang .................. H01L 21/76807 |
| | | 438/738 |
| 2010/0102454 A1* | 4/2010 | Akiyama .......... H01L 27/14618 |
| | | 257/774 |

(Continued)

OTHER PUBLICATIONS

Civale, et al., "A Novel Concept for Ultra-Low Capacitance via-Last TSV", 2010 IEEE International BD Systems Integration Conference (3DIC). IEEE, 2010, 4 pages.

(Continued)

*Primary Examiner* — Herve-Louis Y Assouman (74) *Attorney, Agent, or Firm* — Brake Hughes Bellermann LLP (57) ABSTRACT

A method includes etching a through-substrate via (TSV) in a substrate from a backside of the substrate. The substrate has a device layer on a frontside. The method further includes depositing a conformal spacer layer on the backside of the substrate, and sidewalls and a bottom of the TSV, and etching the spacer layer to form a self-aligned mask for etching a contact opening at the bottom of TSV to a metal pad in the device layer, and etching the contact opening at the bottom of TSV to the metal pad in the device layer. The method further includes disposing a conductive material layer in the TSV and the contact opening to make a vertical interconnection from the backside of the substrate to the metal pad in the device layer.

21 Claims, 9 Drawing Sheets

(51) Int. Cl.
*H01L 21/768* (2006.01)
*H01L 25/00* (2006.01)
*H01L 25/065* (2023.01)
*H01L 25/18* (2023.01)
*H01L 27/146* (2006.01)

(58) Field of Classification Search
CPC ..... H01L 2224/131; H01L 2224/80896; H01L 27/14621; H01L 27/14636; H01L 27/1464; H01L 27/14683; H01L 25/0657; H01L 25/50; H01L 2224/08145; H01L 2224/13025; H01L 2224/73251; H01L 2224/80895; H01L 2225/06517; H01L 2225/06524; H01L 2225/06541; H01L 2225/06589; H01L 2924/1431; H01L 2924/1434; H01L 21/76898
See application file for complete search history.

(56) References Cited

U.S. PATENT DOCUMENTS

| | | | | |
|---|---|---|---|---|
| 2011/0227230 | A1* | 9/2011 | Gu | H01L 21/76898 257/E21.585 |
| 2012/0139127 | A1* | 6/2012 | Beyne | H01L 21/76898 257/E21.586 |
| 2012/0146098 | A1* | 6/2012 | Dahlstrom | H01L 21/76224 257/E21.546 |
| 2013/0264676 | A1* | 10/2013 | Yang | H01L 21/76898 257/774 |
| 2014/0051228 | A1* | 2/2014 | Chausse | H01L 21/76224 438/424 |
| 2015/0102497 | A1* | 4/2015 | Park | H01L 21/6835 257/774 |
| 2015/0179546 | A1* | 6/2015 | Wakiyama | H01L 21/30604 438/455 |
| 2015/0255495 | A1* | 9/2015 | Park | H01L 27/14621 257/446 |
| 2018/0151475 | A1* | 5/2018 | Oshige | H01L 21/76832 |

OTHER PUBLICATIONS

Dai, et al., "Study of Metal Mask Assisted TSV Bottom the Dielectric Layer Etching Process", 2014 15th International Conference on Electronic Packaging Technology, 2014, pp. 418-421.
Hofmann, et al., "3D Wafer Level Packaging By Using Cu-Through Silicon Vias for Thin MEMS Accelerometer Packages", 2015, 9 pages.
Hofmann, et al., "Investigations on Partially Filled HAR TSVS for MEMS Applications", IEEE, 2013, 3 pages.
Hofmann, et al., "Study on TSV Isolation Liners for a via Last Approach With the Use in 3D-WLP for MEMS", 2016, 13 pages.
Tezcan, et al., "Sloped Through Wafer Vias for 3D Wafer Level Packaging", 2007 Electronic Components and Technology Conference, IEEE, 2007, pp. 643-647.

* cited by examiner

SELF-ALIGNED CONTACT OPENINGS FOR BACKSIDE THROUGH SUBSTRATE VIAS

RELATED APPLICATION

This application claims priority to and the benefit of U.S. Provisional Application No. 62/914,289, filed Oct. 11, 2019, which is incorporated herein by reference in its entirety.

TECHNICAL FIELD

The present disclosure relates to relates to three-dimensional semiconductor device structures.

BACKGROUND

Three-dimensional (3D) integration technologies are used to reduce the size or footprint of small form factor (SFF) microsystems. The 3D integration technologies may include 3D stacking of semiconductor or integrated circuit (IC) dies, wafers and packages. A footprint of an IC package can be reduced by using, for example, a stacked structure in which a first semiconductor die or chip is stacked over, and bonded to, a second semiconductor die or chip. Bonding of the first semiconductor die to the second semiconductor die may involve wafer-wafer or die-wafer or wafer-level-packaging (WLP). Vertical interconnections between multiple layers of the stacked semiconductor dies or devices can be accomplished using through substrate vias (TSVs) for realization of circuits with shorter signal path lengths, smaller packages and lower parasitic capacitances.

SUMMARY

In a general aspect, a method includes etching a through-substrate via (TSV) in a substrate from a backside of the substrate. The substrate has a device layer on a frontside. The method further includes depositing a conformal spacer layer on the backside of the substrate, and sidewalls and a bottom of the TSV, and etching the spacer layer to form a self-aligned mask for etching a contact opening at the bottom of TSV to a metal pad in the device layer. The self-aligned mask being formed by the spacer layer deposited on the sidewalls of the TSV. The method further includes etching a contact opening at the bottom of TSV to the metal pad in the device layer.

The details of one or more implementations are set forth in the accompanying drawings and the description below. Other features will be apparent from the description and drawings, and from the claims.

DETAILED DESCRIPTION

Through-substrate vias (TSVs) (also can be referred to as a through-chip vias or as through-silicon vias if a silicon substrate is used), which are etched into a semiconductor substrate, can provide vertical interconnect access for electrical connection to components embedded in a device layer (e.g., an insulator material layer) disposed on the semiconductor substrate.

TSVs are high-performance interconnect techniques used as an alternative to wire-bond and flip chips to create 3D packages and 3D integrated circuits. The TSV interconnects may allow electronic devices to be stacked vertically for a broad range of applications and performance improvements such as increased bandwidth, reduced signal delay, improved power management, and smaller form-factors. A TSV may, for example, be used to access a device formed on the front side of the semiconductor substrate from a backside of the semiconductor substrate. In some instances (e.g., in system level integration architecture) multiple strata (layers) of planar devices are stacked and interconnected using through-silicon vias (TSVs).

Making a TSV (e.g., a backside TSV) involves lithographic patterning to define an opening (e.g., a back surface opening) on a backside of a silicon substrate, and using a first etch (e.g., a silicon etch) to dig a hole (via) in the silicon substrate from the backside surface to a frontside of the silicon substrate. An insulating liner (e.g., a dielectric such as silicon dioxide ($SiO_2$) or silicon nitride ($SiN_x$)) may be deposited on sidewalls (and a bottom) of the via to electrically insulate the via from the surrounding silicon. A second dielectric etch (e.g., a contact etch) may be performed to clear the insulating liner at the bottom of the via, and to make a contact opening through the bottom of the via, for example, to expose a metal line or pad (bonding pad) embedded in an insulator layer disposed on the front side of the silicon substrate. The contact opening may extend from the silicon substrate to the metal pad through any intervening insulator material that may be disposed around the metal pad. Conductive material (e.g., copper, aluminum, etc.) may be then placed in the via to make an electrical connection from the backside of the silicon substrate to the metal pad embedded in the device on the front side of the silicon substrate.

The contact etch used for making the contact opening may use the insulating liner on the TSV sidewalls of the via as a dielectric spacer or mask to delimit the contact opening at the bottom of the TSV. However, the insulating liner (e.g., $SiO_2$ or $SiN_x$) on the TSV sidewalls itself is likely to be degraded (e.g., thinned, or etched) by the contact etch. In many instances, for a small diameter TSV (e.g., a TSV having diameter less than about 10 µm), the degradation of the insulating liner (e.g., loss of thickness, chamfering of edges, etc.) on the TSV sidewalls can result in loss of lithographic control, insulation failure, and unacceptable electrical behavior and reliability of the device.

In accordance with the principles of the present disclosure, an additional protective layer of material may be used to shield the insulating liner (e.g., $SiO_2$ or $SiN_x$) on the TSV sidewalls. The additional protective layer disposed on the sidewalls also functions as a self-aligned mask for making a contact opening through the bottom of the via, for example, to expose a metal line or pad (bonding pad) embedded, for example, to a metal pad in a device layer disposed on the substrate.

Example apparatus and methods for fabricating backside TSVs are disclosed herein. The methods, for example, may involve using a self-aligned structure to open a contact opening at the bottom of a backside TSV to expose a metal pad embedded in insulating material layer on a front side of a substrate. In example implementations, the self-aligned structures may use a spacer material that is a different material than the dielectric or insulator material (e.g., $SiO_2$, $SiN_x$) used as a sidewall liner in the TSV. This different spacer material may form a self-aligned mask to define a contact opening at the bottom of a backside TSV, and also protect the sidewall liner during the contact etch. In example implementations, self-aligned structures may involve disposable spacer structures, permanent spacer structures, ring-shaped or annular spacer structures. The permanent spacer structures may use either conductor or insulator materials as spacer materials.

Figure 1A:
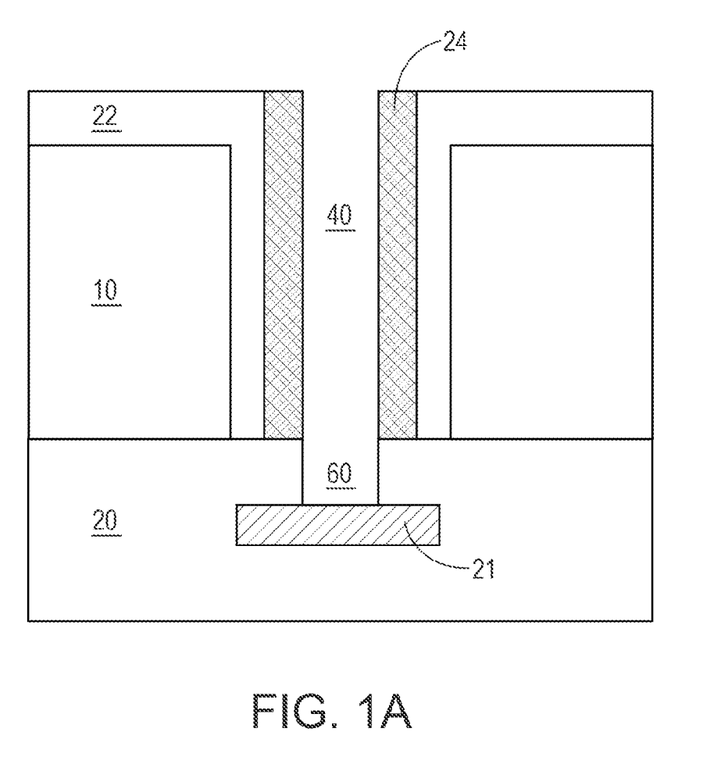
FIG. 1A illustrates a self-aligning mask for a making contact opening from through-substrate via (TSV) to access a metal pad in a device layer on the substrate, in accordance with the principles of the present disclosure.

FIG. 1A shows a portion of a device die 25 illustrating a self-aligned mask 24 for a making contact opening 60 from through-substrate via (TSV) 40 to access a metal pad 21 in a device layer 20 on a substrate 10. The self-aligned mask 24 may be configured to protect dielectric or insulator material 22 (e.g., $SiO_2$, $SiN_x$) lining sidewalls of the TSV during etching of the contact the opening 60.

Figure 1B:
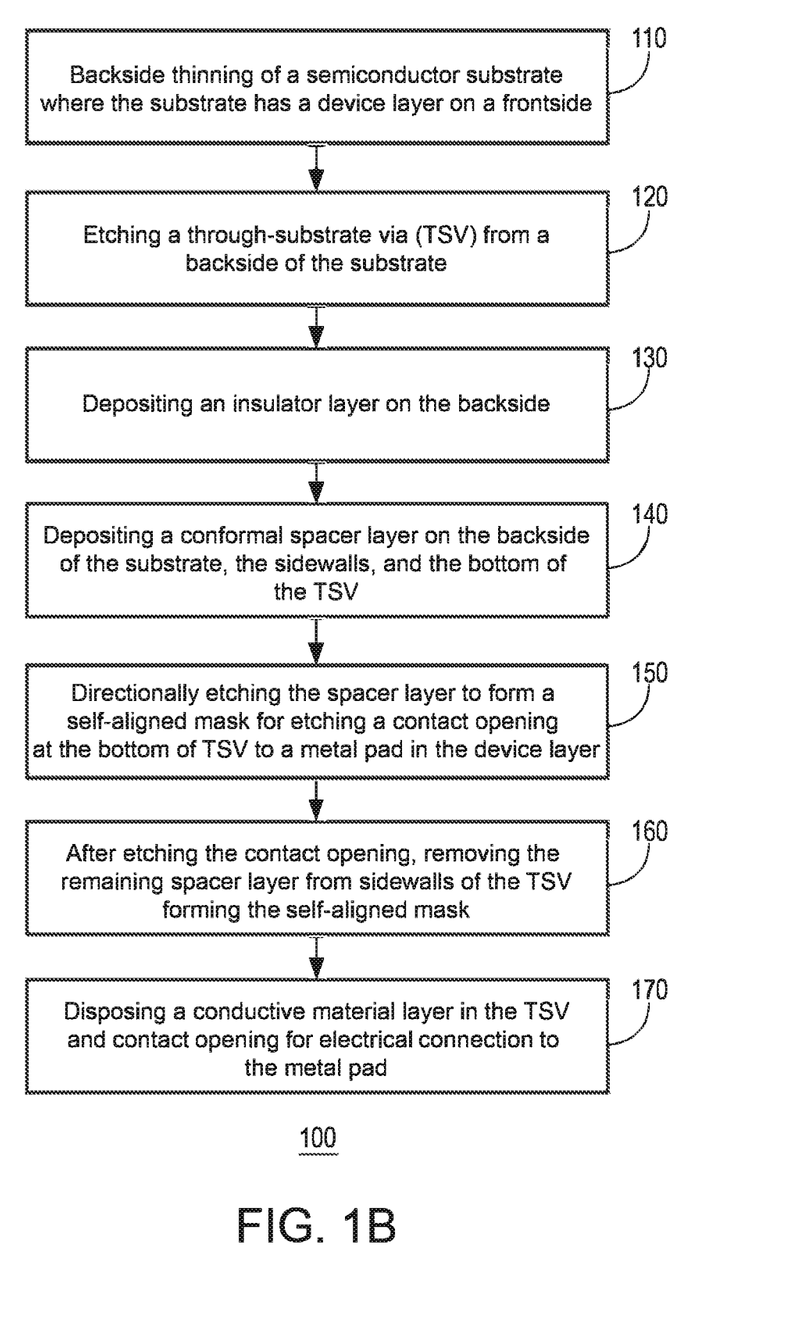
FIG. 1B illustrates an example method for making a vertical interconnection through stacked layers of a semiconductor device, in accordance with the principles of the present disclosure.

FIG. 1B illustrates an example method 100 using disposable spacer structures as self-aligned masks for making a contact opening at a bottom of a backside TSV to expose a metal pad embedded in insulator material in a device layer disposed on a frontside of a substrate. A disposable spacer layer may, for example, be made of a silicate glass (e.g., phosphosilicate glass (PSG)).

Method 100 may include backside thinning of a semiconductor substrate, where the substrate has a device layer on a frontside (110), etching a through-substrate via (TSV) from a backside of the substrate (120), and depositing an insulator layer on the backside on the backside of the substrate, the sidewalls and the bottom of the TSV (130) This insulator layer may, for example, be made of SiO2, or SiNx, etc. Method 100 may further include depositing a conformal spacer layer on the backside of the substrate, the sidewalls, and the bottom of the TSV (140).

Method 100 may further include directional etching of the spacer layer to create a self-aligned mask for etching a contact opening at the bottom of TSV to a metal pad in the device layer (150), and after etching the contact opening, removing the remaining spacer layer from sidewalls of the TSV forming the self-aligned mask (160). Method 100 may further include disposing a conductive material layer in the TSV and contact opening for electrical connection to the metal pad (170).

An example semiconductor device fabrication process implementing method 100 for fabricating TSVs for vertical interconnection is described in connection with FIGS. 2A-2F. FIGS. 2A through 2F illustrate cross-sectional views of a substrate as it is being processed through multiple steps of the semiconductor device fabrication process to fabricate a TSV interconnect between a backside of the substrate and a device component on a frontside of the substrate, in accordance with the principles of the present disclosure. While like reference characters or numerals are used to label like elements throughout the various drawings, some of the elements are not labeled in some of the figures for visual clarity in views and simplicity in description.

The semiconductor device fabrication process shown in FIGS. 2A-2F may be referred to as a disposable-spacer TSV fabrication process hereinafter. The multiple steps of the disposable-spacer TSV fabrication process may, for example, involve wafer level processing of the substrate layer-by-layer. These steps may, for example, include photoresist coating, lithographic patterning, deposition, and removal of materials on (or of) the substrate.

Figure 2A:
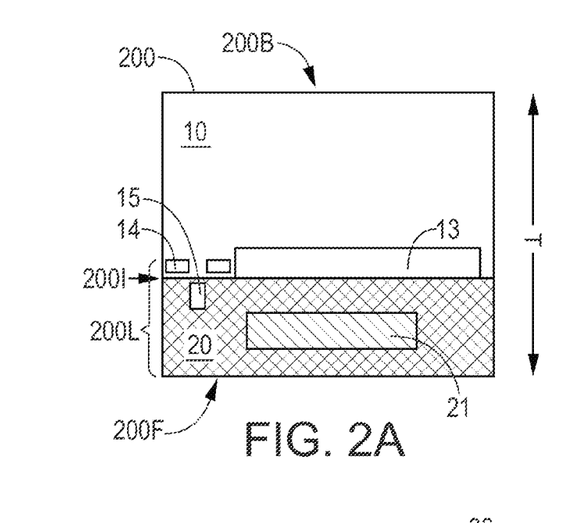
FIGS. 2A through 2F illustrate cross-sectional views of a substrate as it is being processed through multiple steps of a semiconductor device fabrication process according to the method of FIG. 1B, in accordance with the principles of the present disclosure.

As shown in FIG. 2A, the disposable-spacer TSV fabrication process begin by selecting a thinned semiconductor substrate 200 (e.g., a silicon (Si) wafer 10) having a backside 200B and a frontside 200F. Semiconductor substrate 200 may include electronic device elements (e.g., logic device elements) fabricated in a layer (e.g., a logic layer 200L). For example, logic layer 200L may include device elements such as device electrodes 14 and a device gate 15 next to a shallow trench isolation (STI) element 13 formed in, or about, an interface (e.g., interface 200I) between Si wafer 10 and an insulator layer 20 disposed on frontside 200F. Insulator layer 20 may include metallization elements (e.g., a first level metallization (M1) element, metal pad 21)) for electrical connection to the device elements. A goal of the TSV fabrication process is a vertical interconnection TSV (FIG. 2F) from backside 200B of substrate 10 to metal pad 21 through the substrate.

Insulator layer 20 may, for example, be made of any of silicon dioxide ($SiO_2$), silicon nitride (SiN), and or silicon oxynitride (SiON) materials, or a combination thereof. The thinned semiconductor substrate may, for example, be a silicon wafer of any diameter (e.g., a 51 mm diameter substrate, a 76 mm diameter substrate, a 125 mm substrate, a 150 mm diameter substrate, a 200 mm diameter substrate, a 300 mm diameter substrate, or a 450 mm diameter substrate). Thinned semiconductor substrate 200 may have been backside thinned (e.g., by backside grinding and polishing) after device fabrication. In example implementations, thinned semiconductor substrate 200 may have a thickness T of about a few micrometers (e.g., 1 µm through 20 µm).

Figure 2B:
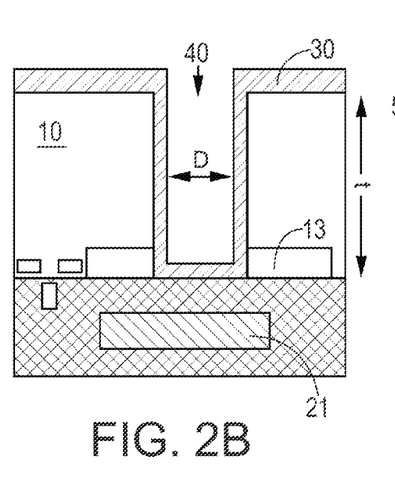

As shown in FIG. 2B, the disposable-spacer TSV fabrication process may further include etching a via (e.g., TSV 40) from backside 200B toward metal pad 21 in logic layer 200L, and depositing an insulating dielectric liner 30 on backside 200B, and the sidewalls and bottom of TSV 40. The via (e.g., TSV 40) may be lithographically aligned with metal pad 21 in insulator layer 20.

TSV 40 may extend from backside 200B through Si wafer 10, and form a bottom at interface 200I with insulator layer 20. In example implementations, TSV 40 may have diameter D of about 0.5 µm to about 10 µm, and a depth (t) of about 1 to 10 µm.

Etching the TSV 40 may involve using an anisotropic silicon etch (e.g., a reactive ion etching (RIE)) to remove silicon material. Depositing insulating dielectric liner 30 may include depositing silicon dioxide ($SiO_2$) and or silicon nitride ($SiN_x$)). In example, implementations, insulating dielectric liner 30 may have a thickness of about 50 to 200 nanometers.

Figure 2C:
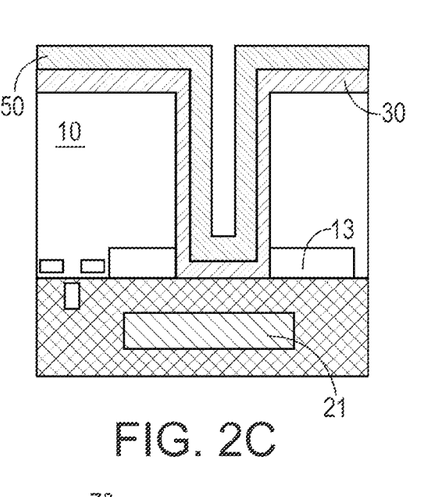

As shown in FIG. 2C, the disposable-spacer TSV fabrication process may further include depositing a spacer layer 50 on backside 200B and in TSV 40. Spacer layer 50 may be deposited over the already deposited insulating dielectric liner 30. In example implementations, spacer layer 50 may be made of a silicate glass (e.g., PSG). Depositing spacer layer 50 may include depositing the PSG as a generally conformal layer on backside 200B, and on the sidewalls and bottom of TSV 40. In example implementations, spacer layer 50 (PSG) may have thickness of about 50 to 200 nanometers.

Figure 2D:
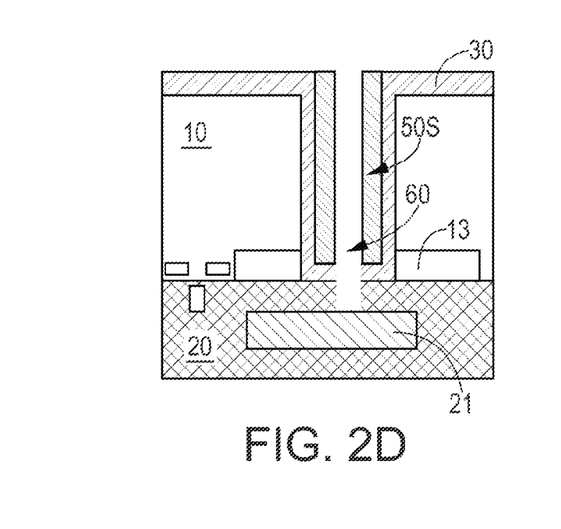

As shown in FIG. 2D, the disposable-spacer TSV fabrication process may further include removal of spacer layer 50 deposited on backside 200B and on the bottom of TSV 40 while generally leaving a vertical portion of spacer layer 50 deposited on the sidewalls in place as spacer 50S. Spacer 50S may be self-aligned with metal pad 21 in insulator layer 20.

In example implementations, removal of spacer layer 50 deposited on backside 200B and on the bottom of TSV 40 may be accomplished by reactive ion etching (e.g. $CF_4$, $CHF_3$, or $C_4F_8$-based RIE). The RIE may also serve as a contact etch and open contact opening 60 through the bottom of TSV 40 and insulator layer 20 to expose metal pad 21. Spacer 50S may form a self-aligned mask for contact opening 60 to metal pad 21 in insulator layer 20.

Figure 2E:
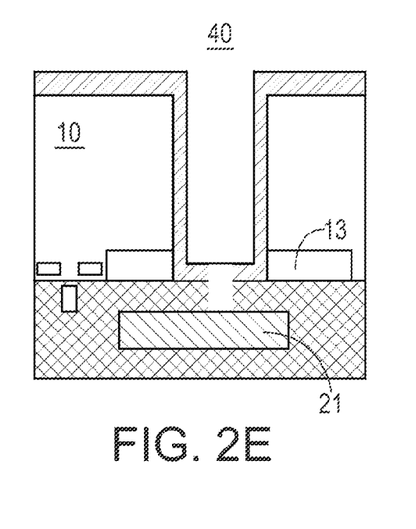

As shown in FIG. 2E, the disposable-spacer TSV fabrication process may further include removal of spacer 50S from TSV 40. In example implementations, a wet etch (e.g., a 100:1 dilute hydrofluoric acid (DHF) etch) may be used to etch spacer 50S deposited on sidewalls of TSV 40.

Figure 2F:
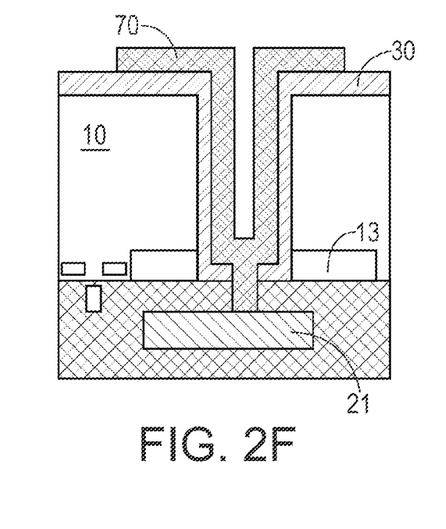

As shown in FIG. 2F, the disposable-spacer TSV fabrication process may further include disposing a conductive material layer 70 in TSV 40 and contact opening 60 to make a vertical electrical connection from backside 200B to metal pad 21. In example implementations, the conductive material layer 70 may include any metallic material (e.g., aluminum (Al), copper (Cu), metal alloys, etc.). In an example implementation, conductive material layer 70 may be 100 nanometer to 1000 nanometer thick layer of Cu deposited on a 10 to 50 nm thick barrier layer of titanium (Ti), tantalum (Ta), or tantalum nitride (TaN).

Figure 3:
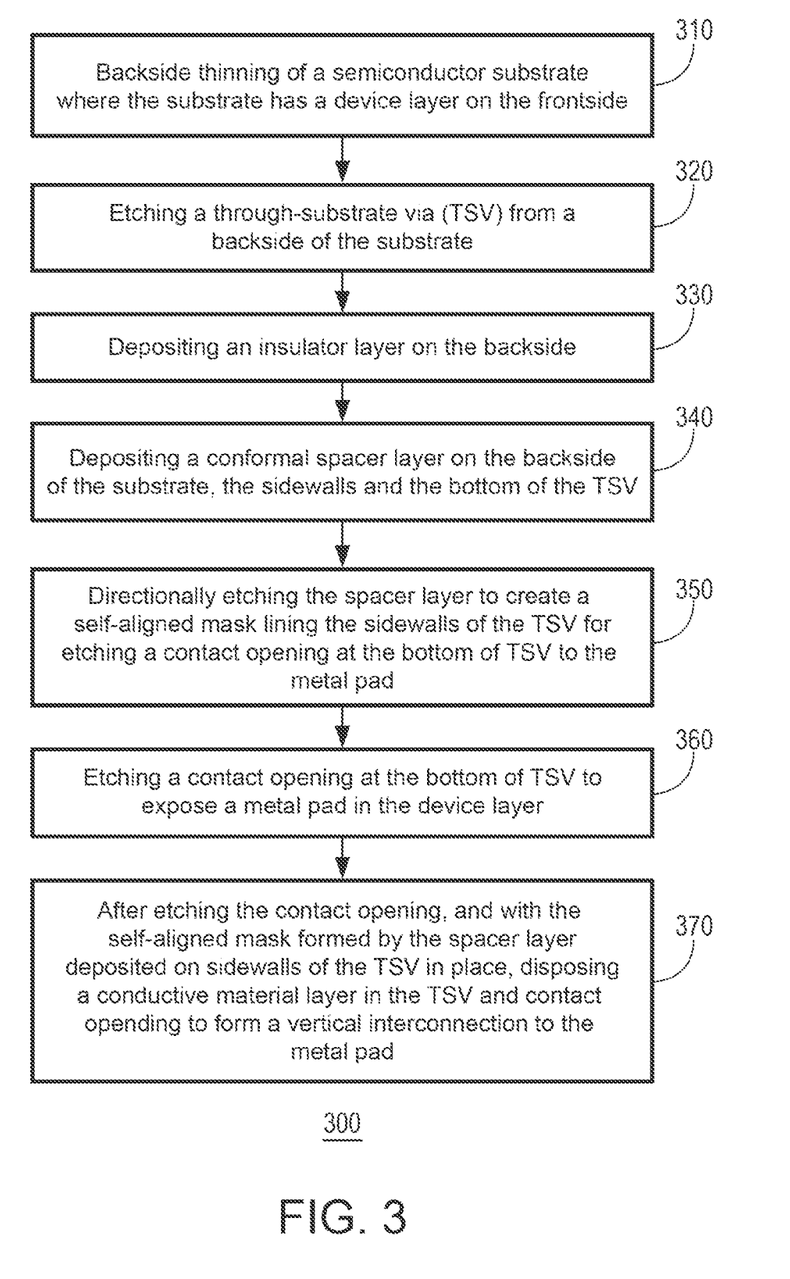
FIG. 3 illustrates an example method for making a vertical interconnection through stacked layers of a semiconductor device, in accordance with the principles of the present disclosure.

FIG. 3 illustrates an example method 300 using permanent spacer structures as self-aligned masks for making a contact opening at a bottom of a backside TSV to expose a metal pad embedded in insulator material disposed on a frontside of a substrate. A permanent spacer structure may, for example, be made of a refractory metal (e.g., tungsten (W), titanium (Ti), molybdenum (Mo), or tantalum (Ta), etc.).

Method 300, like method 100, may include backside thinning of a semiconductor substrate where the substrate has a device layer on a frontside (310), etching a through-substrate via (TSV) from a backside of the substrate (320), and depositing an insulator layer on the backside (330).

Method 100 may further include depositing a conformal spacer layer on the backside of the substrate, the sidewalls and the bottom of the TSV (340), and directionally etching the spacer layer to create a self-aligned mask lining the sidewalls of the TSV for etching a contact opening at the bottom of TSV to the metal pad (350). The spacer layer may be made of a refractory metal (e.g., tungsten (W), titanium (Ti), etc.). In example implementations, the spacer layer may be tungsten, and the directional etching may be accomplished by reactive ion etching (RIE) (e.g., $SF_6$-based RIE or $Cl_2/O_2$ RIE).

Method 300 may further include etching a contact opening at the bottom of TSV to expose a metal pad in the device layer (350). The spacer layer (e.g., tungsten (W)) deposited on the sidewalls of the TSV may form a self-aligned mask for etching the contact opening. Method 300 may further include, after etching the contact opening, and with the self-aligned mask formed by the spacer layer deposited on sidewalls of the TSV in place, disposing a conductive material layer in the TSV and contact opening to form a vertical interconnection to the metal pad (360).

An example semiconductor device fabrication process implementing method 300 for fabricating TSVs for vertical interconnection is described in connection with FIGS. 4A through 4E. FIGS. 4A through 4E illustrate cross-sectional views of a substrate as it is being processed through multiple steps of the semiconductor device fabrication process to fabricate a TSV interconnect between a backside of the substrate and a device component on a frontside of the substrate, in accordance with the principles of the present disclosure.

The semiconductor device fabrication process shown in FIGS. 4A through 4E may be referred to as a permanent-spacer TSV fabrication process hereinafter. The multiple steps or permanent-spacer TSV fabrication process may, for example, involve wafer level processing of the substrate layer-by-layer. These steps may, for example, include photoresist coating, lithographic patterning, deposition, and removal of materials on (or of) the substrate.

Figure 4A:
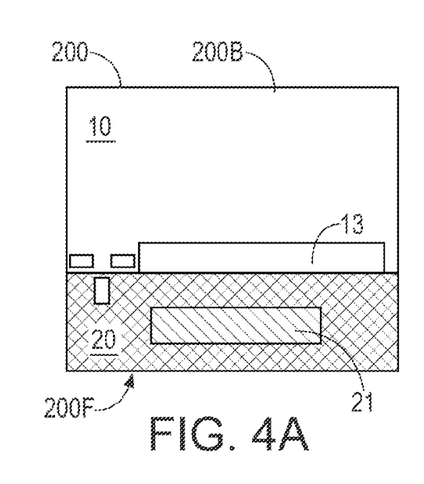
FIGS. 4A through 4E illustrate cross-sectional views of a substrate as it is being processed through multiple steps of a semiconductor device fabrication process according to the method of FIG. 3, in accordance with the principles of the present disclosure.

As shown in FIG. 4A, the permanent-spacer TSV fabrication process (like disposable-spacer TSV fabrication process, FIGS. 2A through 2C) may begin by selecting a thinned semiconductor substrate 200 (e.g., a silicon (Si) wafer 10) having a backside 200B and a frontside 200F. A goal of the permanent-spacer TSV fabrication process is a vertical interconnection TSV (FIG. 4E) from backside 200B to metal pad 21 through the substrate.

Figure 4B:
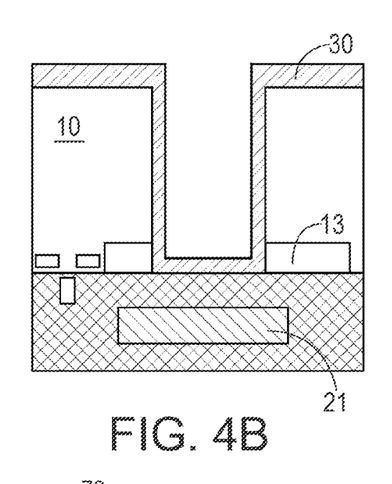

As shown in FIG. 4B, the permanent-spacer TSV fabrication process (like disposable-spacer TSV fabrication process, FIGS. 2A through 2C) may include etching a via (e.g., TSV 40) from backside 200B toward metal pad 21, and depositing an insulating dielectric liner 30 on backside 200B and the sidewalls of TSV 40. The via (e.g., TSV 40) may be lithographically aligned with metal pad 21 in insulator layer 20.

Figure 4C:
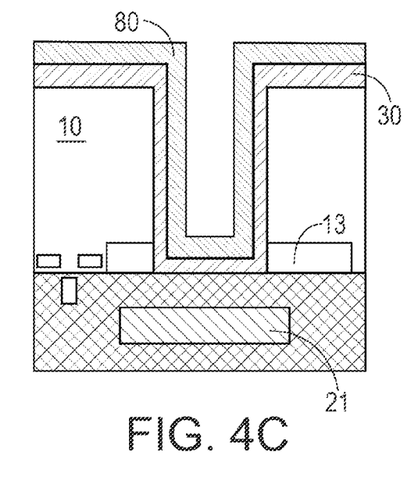
Figure 4D:
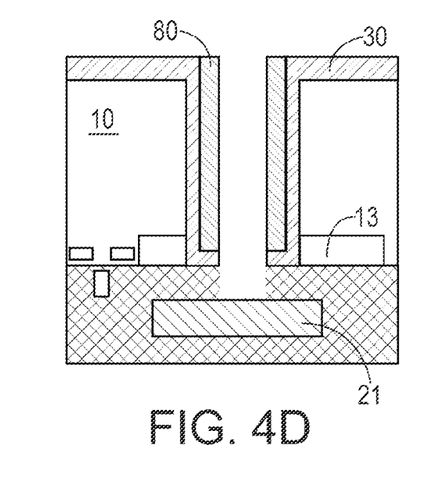

As shown in FIG. 4C, the permanent-spacer TSV fabrication process TSV fabrication process may further include forming a spacer 80S on sidewalls of TSV 40. In example implementations, spacer 80S may be made of tungsten material. In example implementations, forming spacer 80S may include depositing a tungsten layer on backside 200B and in TSV 40. The tungsten layer may be about 50 to 200 nanometers thick and deposited on a barrier layer of titanium/titanium nitride (Ti/TiN) about 10 to 20 nanometers thick. Forming spacer 80S may further include removing excess tungsten (e.g., tungsten deposited on backside 200B and on the bottom of TSV 40) while generally leaving a vertical portion of tungsten deposited on the sidewalls in place as spacer 80S. Spacer 80S may be self-aligned with metal pad 21 in insulator layer 20.

In example implementations, removal of excess tungsten to form spacer 80S on sidewalls of TSV 40 may be accomplished by halogen-based reactive ion etching (e.g. $SF_6$-based RIE, or a $Cl_2/O_2$ RIE). The RIE may also serve as a contact etch and open contact opening 60 through the bottom of TSV 40 and insulator layer 20 to expose metal pad 21. Spacer 80S may form a permanent self-aligned mask for contact opening 60 to metal pad 21 in insulator layer 20.

Figure 4E:
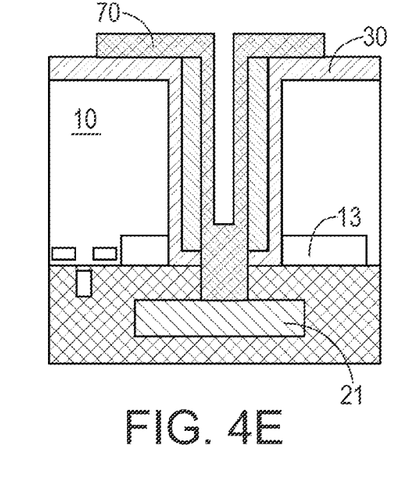

As shown in FIG. 4E, the permanent-spacer TSV fabrication process may further include disposing a conductive material layer 70 in TSV 40 and contact opening 60 to make a vertical electrical connection from backside 200B to metal pad 21. In example implementations, the conductive material layer 70 may include any metallic material (e.g., aluminum (Al), copper (Cu), metal alloys, etc.). In an example implementation, conductive material layer 70 may be a 100 nanometers to 1000 nanometers thick layer of Cu deposited on a 10 to 50 nanometers thick barrier layer of titanium (Ti), tantalum (Ta), or tantalum nitride (TaN). Conductive material layer 70 deposited on sidewalls of the TSV may remain in contact with spacer 80S (which is not removed) in the vertical electrical connection to metal pad 21.

Figure 5:
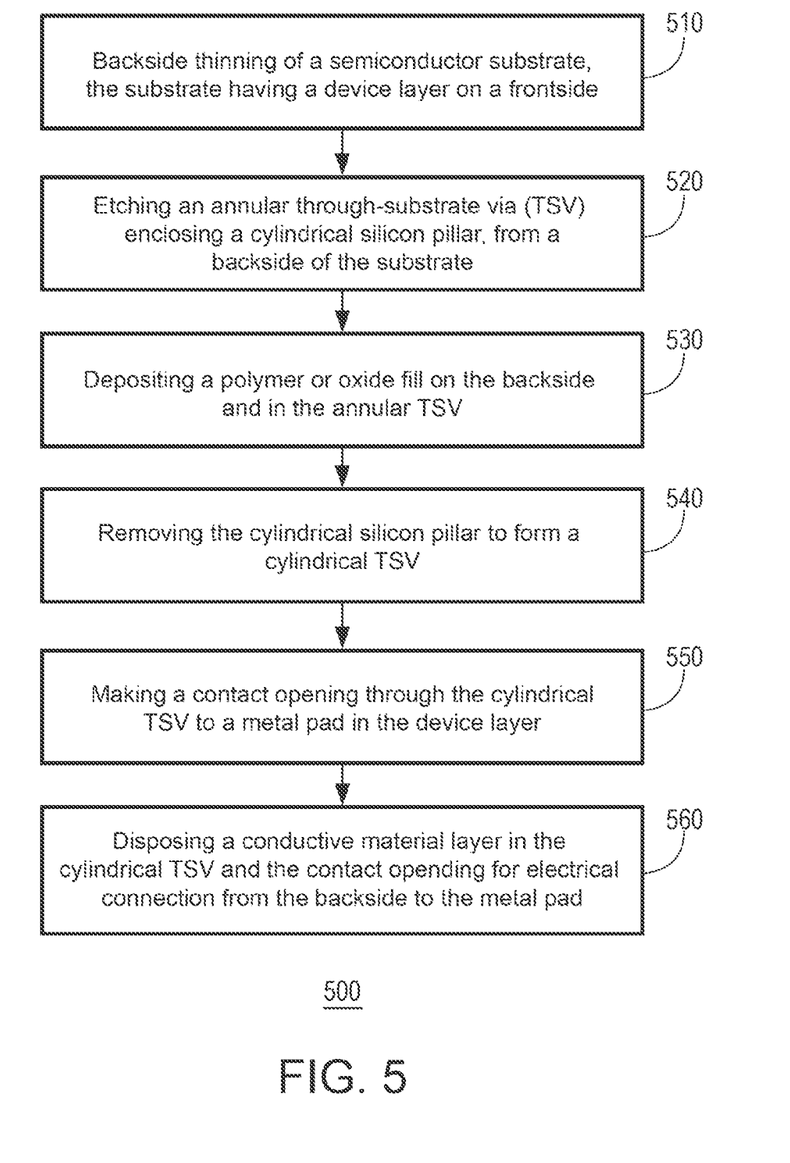
FIG. 5 illustrates an example method for making a vertical interconnection through stacked layers of a semiconductor device, in accordance with the principles of the present disclosure.

FIG. 5 illustrates an example method 500 using annular TSV structures for making a contact opening at a bottom of a backside TSV to expose a metal pad embedded in insulator material disposed on a frontside of a substrate.

Method 500, like method 100 (FIG. 1B) and method 300 (FIG. 3), may include backside thinning of a semiconductor substrate, the substrate having a device layer on a frontside (510). Method 500 may further include etching an annular through-substrate via (TSV) enclosing a cylindrical pillar of substrate material, from a backside of the substrate (520), and depositing a polymer or oxide fill on the backside of the substrate and in the annular TSV (530). Method 500 may further include removing the cylindrical pillar of substrate material to form a cylindrical TSV (540). When removing the cylindrical pillar of substrate material to form the cylindrical TSV, the polymer or oxide fill deposited in the annular TSV may remain to line sidewalls of the cylindrical TSV. Method 500 may further include making a contact opening through the cylindrical TSV to a metal pad in the device layer (550), and disposing a conductive material layer in the cylindrical TSV and the contact opening for making an electrical connection from the backside to the metal pad (560).

An example semiconductor device fabrication process implementing method 500 for fabricating TSVs for vertical interconnection is described in connection with FIGS. 6A through 6E. FIGS. 6A through 6E illustrate cross-sectional views of a substrate as it is being processed through multiple steps of the semiconductor device fabrication process to fabricate a TSV interconnect between a backside of the substrate and a device component on a frontside of the substrate, in accordance with the principles of the present disclosure.

The semiconductor device fabrication process shown in FIGS. 6A through 6E may be referred to as an annular-spacer TSV fabrication process hereinafter. The multiple steps or annular-spacer TSV fabrication process may, for example, involve wafer level processing of the substrate layer-by-layer. These steps may, for example, include photoresist coating, lithographic patterning, deposition, and removal of materials on (or of) the substrate.

Figure 6A:
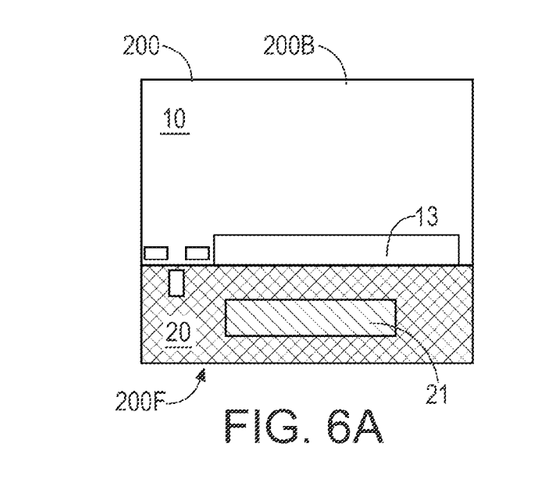
FIGS. 6A through 6E illustrate cross-sectional views of a substrate as it is being processed through multiple steps of a semiconductor device fabrication process according to the method of FIG. 5, in accordance with the principles of the present disclosure.

As shown in FIG. 6A, the annular-spacer TSV fabrication process (like the disposable-spacer TSV fabrication process, FIGS. 2A through 2C) may begin by selecting a thinned semiconductor substrate 200 (e.g., a silicon (Si) wafer 10) having a backside 200B and a frontside 200F. A goal of the annular-spacer TSV fabrication process is a vertical interconnection TSV (FIG. 6E) from backside 200B to metal pad 21 through the substrate.

Figure 6B:
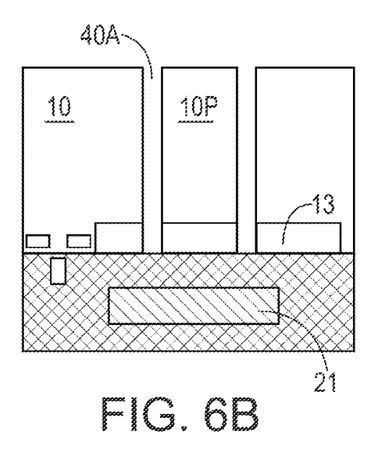

As shown in FIG. 6B, the annular-spacer TSV fabrication process may include etching an annular via (e.g., annular TSV 40A) from backside 200B toward metal pad 21. Annular TSV 40 may enclose a cylindrical silicon pillar 10P. The via (e.g., TSV 40A) may be lithographically aligned with metal pad 21 in insulator layer 20.

Figure 6C:
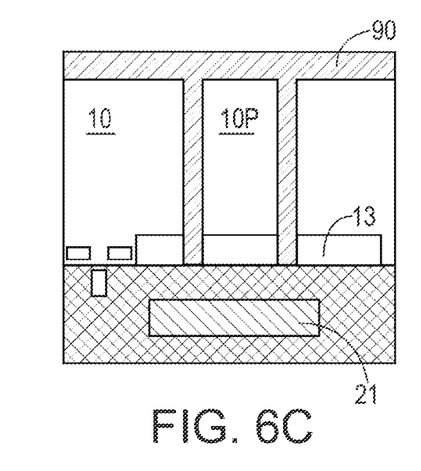

As shown in FIG. 6C, the annular-spacer TSV fabrication process may further include depositing a polymer (or oxide) fill 90 on backside 200B and in the annular spaces of annular TSV 40A. The polymer (or oxide) fill 90 in annular spaces of annular TSV 40A may enclose and be in contact with enclosed cylindrical silicon pillar 10P.

Figure 6D:
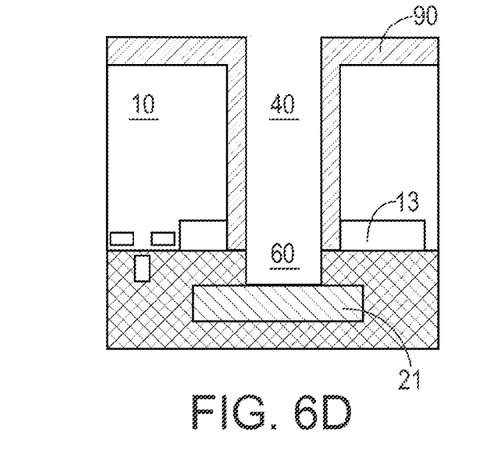

As shown in FIG. 6D, the annular-spacer TSV fabrication process further includes removal of cylindrical silicon pillar 10P to form cylindrical TSV 40. The removal of cylindrical silicon pillar 10P may involve photolithography definition of an area on backside 200B and silicon etching for removal of cylindrical silicon pillar 10P.

In example implementations, cylindrical silicon pillar 10P and formation of cylindrical TSV 40 may be accomplished by reactive ion etching (e.g. $CF_4$, $CHF_3$, or $C_4F_8$-based RIE). The RIE may also serve as a contact etch and open contact opening 60 through the bottom of cylindrical TSV 40 and insulator layer 20 to expose metal pad 21. During the etching, polymer fill 90 deposited on the annual spaces of annular TSV 40A may remain in place as an annular spacer on sidewalls of TSV 40 to protect and insulate the silicon adjoining cylindrical TSV 40.

Figure 6E:
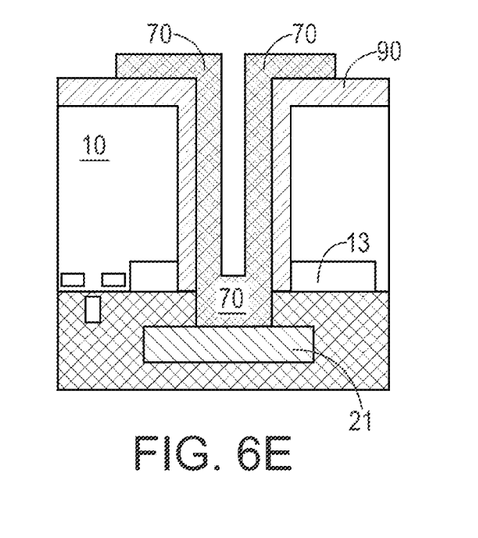

As shown in FIG. 6E, the annular-spacer TSV fabrication process may further include disposing a conductive material layer 70 in TSV 40 and contact opening 60 to make a vertical electrical connection from backside 200B to metal pad 21. In example implementations, conductive material layer 70 may include any of any metallic material (e.g., aluminum (Al), copper (Cu), metal alloys, etc.). In an example implementation, conductive material layer 70 may be 100 nm to 1000 nm thick layer of Cu deposited on a 10 to 50 nanometers thick barrier layer of titanium (Ti), tantalum (Ta), or tantalum nitride (TaN).

In the foregoing, the methods (e.g., methods 100, 300 and 500, FIGS. 1, 3, and 5) for making vertical interconnections between multiple layers of stacked semiconductor dies or devices were illustrated, only for convenience in description, using an example semiconductor substrate (e.g., substrate 200) having a single stacked device layer (e.g., logic layer 200L on substrate 200, FIG. 2A).

Figure 7:
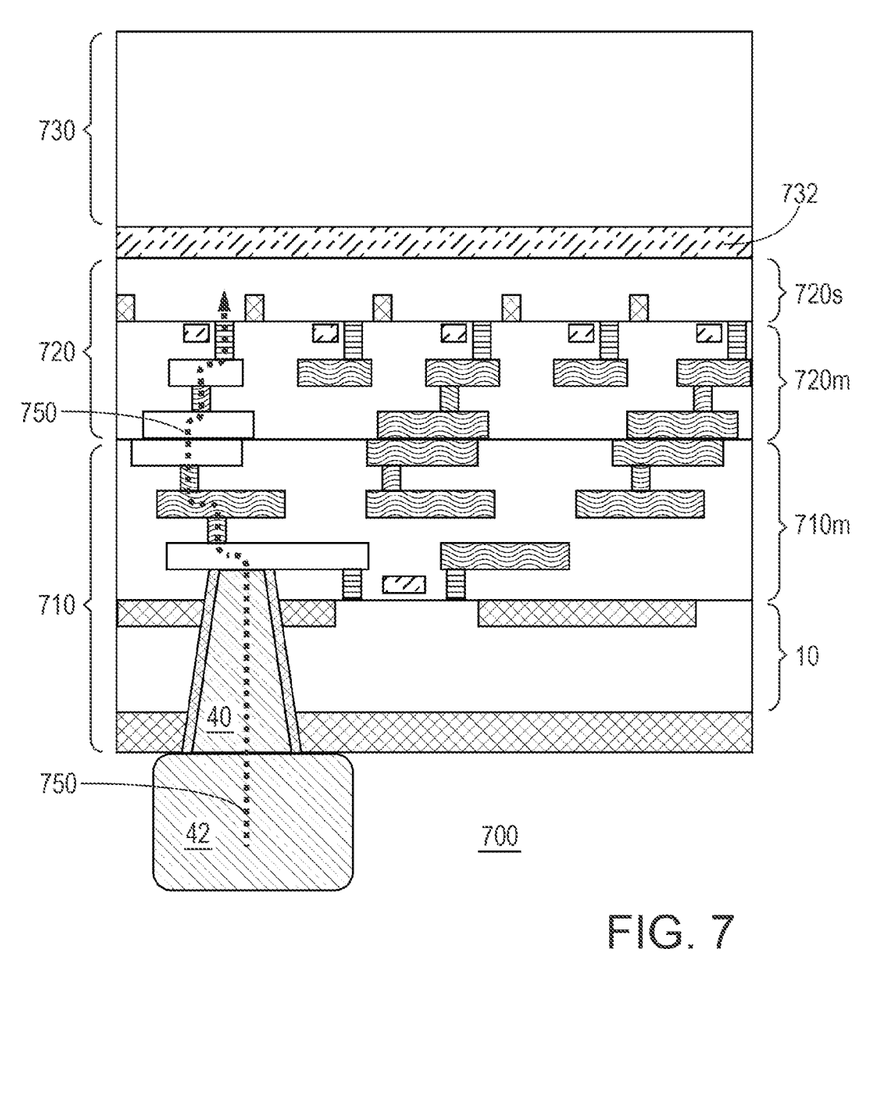
FIG. 7 and FIG. 8 illustrate stacked semiconductor dies or devices in which TSVs make vertical interconnections across multiple layers of the stacked semiconductor dies or devices, in accordance with the principles of the present disclosure.
Figure 8:
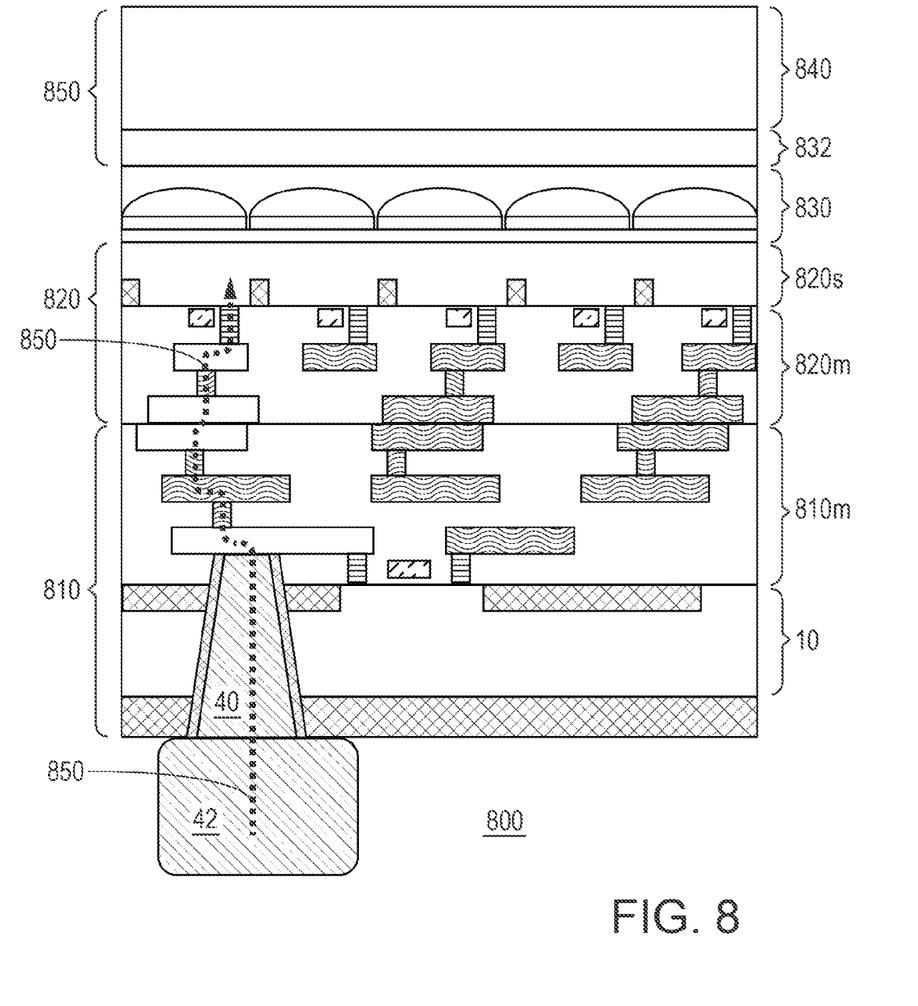

FIG. 7 and FIG. 8 show example stacked semiconductor dies or devices in which the described methods can be used to make TSVs for vertical interconnections across multiple layers of the stacked semiconductor dies or devices.

FIG. 7 shows, for example, a multi die stacked structure 700 (e.g., a memory-on-logic structure). Structure 700 may include a logic die 710, a memory die 720 and a heat sink wafer or die 730 that are stacked and bonded together. Heat sink die 730 may be bonded (e.g., using adhesive 732) to memory die 720.

Logic die 710 may include a device layer 710m formed on substrate 10. Device layer 710m may include three interconnected levels of metallization, M1, M2 and M3. Memory die 720 may include a device layer 720m formed on substrate 720s. Logic die 710 and memory die 720 may be bonded together (hybrid bonding) so that a metallization pad M2 of memory die 720 is bonded to a metallization pad M3 of logic die 710.

A TSV 40 may be fabricated using a method described herein (e.g., method 100, 300 or 500) to provide a vertical connection 750 from a solder bump 42 disposed on a backside of substrate 10 to a M1 pad (e.g., metal pad 21) in device layer 710m. Since the metallization levels M1, M2 and M3 pads in device layer 710m are interconnected, the metallization levels M1 and M2 in device layer 720m are interconnected, the bonding of pad M2 of memory die 720 to pad M3 of logic die 710 allows vertical connection 750 to extend from solder bump 42 across logic die 710 and memory die 720 to substrate 720s.

FIG. 8 shows, for example, a multi die stacked structure 800 (e.g., a complementary metal-oxide-semiconductor (CMOS) image sensor-on-logic structure). Structure 800 may include a logic die 810, a CMOS-image sensor die 820, a color filter-and-lens layer 830, and a glass wafer or die 840 that are stacked and bonded together. Logic die 810 may include a device layer 810m formed on substrate 10. Device layer 810m may include three interconnected levels of metallization M1, M2 and M3. CMOS-image sensor die 820 may include a device layer 820m formed on substrate 820s. Device layer 820m including two interconnected levels of metallization M1 and M2. Logic die 810 and CMOS-image sensor die 820 may be bonded together (hybrid bonding) so that metallization pad M2 of CMOS-image sensor die 820 is bonded to metallization pad M3 of logic die 810. Color-filter-and-lens layer 830 may be placed on CMOS-image sensor die 820 and may include a low refractive index (e.g., n=1.2) overcoat layer 831. Formation of the color-filter-and-lens layer 830 (including the low refractive index overcoat layer) may, for example, involve wafer level processing of the substrate layer-by-layer. The processing may, for example, include color photoresist coating, overcoated lithographic patterning, antireflection coating deposition, and removal of materials on (or of) the substrate. Glass wafer or die 840 may be bonded to color filter-and-lens layer 830 (e.g., using adhesive 832) without any air gaps between the glass and the CMOS image sensor die 820 (or in other words, the CMOS image sensor die is placed in a gapless configuration in which the glass is attached to the sensor without any in-between air gap).

A TSV 40 may be fabricated using a method described herein (e.g., method 100, 300 or 500) to provide a vertical connection (depicted in FIG. 8 as an electrical path 850) from solder bump 42 disposed on a backside of substrate 10 to substrate 820s via a M1 pad (e.g., metal pad 21) in device layer 810m. Since the metallization levels M1, M2 and M3 pads in device layer 810m are interconnected, the metallization levels M1 and M2 in device layer 820m are interconnected, the bonding of pad M2 of CMOS-image sensor die 820 to pad M3 of logic die 810 allows the vertical connection (i.e., electrical path 850) to extend from solder bump 42 across logic die 810 and CMOS-image sensor die 820 to substrate 820s.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method comprising:

etching a through-substrate via (TSV) in a semiconductor substrate from a backside of the semiconductor substrate up to an insulator layer on a frontside of the semiconductor substrate, the insulator layer being exposed at a bottom of the TSV;

depositing an insulating liner on a sidewall of the TSV up to the insulator layer on the frontside of the semiconductor substrate and on the insulator layer exposed at the bottom of the TSV:

depositing a spacer layer, conformally, on the backside of the semiconductor substrate, and on the insulating liner deposited on the sidewall and the bottom of the TSV;

etching the spacer layer to form a self-aligned mask for etching a contact opening through the insulator layer at the bottom of the TSV to a metal pad inside the insulator layer, the self-aligned mask being formed by the spacer layer deposited on the sidewall of the TSV;

etching, through the self-aligned mask, the contact opening through the insulator layer at the bottom of TSV to the metal pad inside the insulator layer; and filling the contact opening through the insulator layer at the bottom of TSV with a conductive material, and depositing a layer of the conductive material on the sidewall of the TSV to form a vertical interconnection from the backside of the semiconductor substrate to the metal pad, the vertical interconnection having a step shape with a width of the vertical interconnection in the contact opening being smaller than the width of the vertical interconnection in the TSV.

2. The method of claim 1, wherein the spacer layer is made of a silicate glass, and wherein the insulating liner includes at least one of silicon dioxide ($SiO_2$) or silicon nitride ($SiN_x$).

3. The method of claim 2, wherein etching the spacer layer includes directional reactive ion etching of the spacer layer leaving the spacer layer deposited on the sidewall of the TSV to form the self-aligned mask.

4. The method of claim 3, further comprising:
after etching the contact opening, removing the spacer layer deposited on the sidewall of the TSV before filling the contact opening at the bottom of TSV with the conductive material, and depositing the layer of the conductive material on the sidewall of the TSV to form the vertical interconnection from the backside of the semiconductor substrate to the metal pad, the vertical interconnection having the step shape.

5. The method of claim 1, wherein a thickness of the layer of the conductive material deposited on the sidewall of the TSV is less than one half a width of the TSV.

6. The method of claim 1, wherein the spacer layer is made of a refractory metal.

7. The method of claim 6, wherein the refractory metal is one of tungsten, titanium or a combination thereof.

8. The method of claim 6, wherein etching the spacer layer includes directional reactive ion etching of the spacer layer leaving the spacer layer deposited on the sidewall to form the self-aligned mask.

9. The method of claim 1, wherein the TSV has a diameter in a range of about 0.5 microns to about 10 microns.

10. The method of claim 1, wherein the width in the contact opening is smaller than the width in the TSV by a thickness of the spacer layer.

11. The method of claim 1, wherein the step shape corresponds to a change in the width of the vertical interconnection at an interface between the bottom of the TSV and a top of the contact opening.

12. A method, comprising:
etching a cylindrical through-substrate via (TSV) in a substrate from a backside of the substrate up to a frontside of the substrate, the cylindrical TSV enclosing a cylindrical pillar of material of the substrate, the substrate having an insulator layer disposed on the frontside of the substrate and including a metal pad;
depositing a polymer or oxide fill material on the backside of the substrate and in the cylindrical TSV;
removing the cylindrical pillar of the material of the substrate to form a cylindrical TSV;
making a cylindrical contact opening through the cylindrical TSV to the metal pad in the insulator layer, the cylindrical contact opening having a diameter that is smaller than a diameter of the cylindrical TSV; and
depositing a layer of a conductive material in the cylindrical contact opening and on sidewalls of the cylindrical TSV to form a tubular vertical interconnection from the backside of the substrate to the metal pad.

13. The method of claim 12, wherein when removing the cylindrical pillar of the material of the substrate to form the cylindrical TSV, the polymer or oxide fill material deposited in the cylindrical TSV remains to line sidewalls of the cylindrical TSV.

14. The method of claim 12, wherein the diameter of the cylindrical TSV in a range of about 0.5 microns to about 10 microns.

15. A method comprising:
etching a through-substrate via (TSV) in a substrate from a backside of the substrate up to a frontside of the substrate, the substrate having an insulator layer disposed on the frontside of the substrate and including a metal pad;
depositing an insulating liner on a sidewall and a bottom of the TSV;
forming a self-aligned mask lining the sidewall of the TSV, the self-aligned mask being a spacer material;
etching a contact opening in the insulator layer at the bottom of the TSV through the self-aligned mask to expose the metal pad inside the insulator layer; and
with the self-aligned mask in place on the sidewall of the TSV, disposing a conductive material layer in the contact opening and on the sidewall of the TSV to form a tubular vertical interconnection to the metal pad, the tubular vertical interconnection including a tubular section in the TSV and a solid cylindrical section in the contact opening to the metal pad.

16. The method of claim 15, wherein the spacer material includes a refractory metal.

17. The method of claim 16, wherein the refractory metal is one of tungsten, titanium, or a combination thereof.

18. The method of claim 15, wherein forming the self-aligned mask lining the sidewall of the TSV includes directional reactive ion etching through the spacer material leaving a portion of the spacer material deposited on the sidewall of the TSV in place to form the self-aligned mask.

19. The method of claim 15, wherein etching the TSV in the substrate includes lithographically aligning the TSV with the metal pad.

20. The method of claim 15, wherein disposing the conductive material layer in the TSV and the contact opening to form the tubular vertical interconnection to the metal pad includes disposing a layer of copper deposited on a layer of titanium (Ti), tantalum (Ta), or tantalum nitride (TaN).

21. The method of claim 20, wherein disposing the conductive material layer in the contact opening and on the sidewall of the TSV to form the tubular vertical interconnection to the metal pad includes disposing the layer of copper in contact with a portion of the spacer material remaining on the sidewall of the TSV.

* * * * *